United States Patent
Hirota

(10) Patent No.: US 8,233,346 B2
(45) Date of Patent: Jul. 31, 2012

(54) START-UP CIRCUIT OF INTERNAL POWER SUPPLY OF SEMICONDUCTOR MEMORY

(75) Inventor: Akihiro Hirota, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 326 days.

(21) Appl. No.: 12/728,318

(22) Filed: Mar. 22, 2010

(65) Prior Publication Data

US 2010/0246306 A1    Sep. 30, 2010

(30) Foreign Application Priority Data

Mar. 26, 2009   (JP) .................................. 2009-076799

(51) Int. Cl.
*G11C 5/14*    (2006.01)
(52) U.S. Cl. ...................................... 365/226; 365/228
(58) Field of Classification Search .................. 365/226, 365/228
See application file for complete search history.

(56) References Cited

U.S. PATENT DOCUMENTS

| 4,804,929 | A  | * | 2/1989  | Kato et al. ...................... 331/57 |
| 5,783,956 | A  | * | 7/1998  | Ooishi ........................... 327/157 |
| 6,693,471 | B2 | * | 2/2004  | Matsushita ................... 327/143 |
| 6,825,644 | B2 | * | 11/2004 | Kernahan et al. ............. 323/283 |
| 6,937,498 | B2 | * | 8/2005  | Shiratake ...................... 365/145 |
| 7,450,361 | B2 | * | 11/2008 | Ito et al. ....................... 361/93.1 |
| 7,501,868 | B2 | * | 3/2009  | Ito ................................. 327/158 |

FOREIGN PATENT DOCUMENTS

| JP | 9121147 A    | 5/1997 |
| JP | 9121447 A    | 5/1997 |
| JP | 10163840 A   | 6/1998 |
| JP | 2003263126 A | 9/2003 |

\* cited by examiner

*Primary Examiner* — Viet Q Nguyen
(74) *Attorney, Agent, or Firm* — Volentine & Whitt, PLLC

(57) ABSTRACT

There is provided a start-up circuit of an internal power supply of a semiconductor memory, including: an odd number of inverters that are connected in series and output a signal indicating whether or not to start to supply power from an internal power supply circuit of the semiconductor memory to an internal power supply circuit, and a discharge unit that is connected to an output side of an inverter at an odd-numbered stage and discharges charges remaining at the connection point between the inverter at the odd-numbered stage and the inverter at the stage immediately thereafter, after supply of power to operate the inverters is stopped.

6 Claims, 8 Drawing Sheets

START-UP CIRCUIT OF INTERNAL POWER SUPPLY OF SEMICONDUCTOR MEMORY

CROSS-REFERENCE TO RELATED APPLICATION

This application is based on and claims priority under 35 USC 119 from Japanese Patent Application No. 2009-076799 filed on Mar. 26, 2009, the disclosure of which is incorporated by reference herein.

BACKGROUND

1. Technical Field

The invention relates to a start-up circuit of an internal power supply of a semiconductor memory.

2. Related Art

In the related art, various technologies for preventing an erroneous operation by removing charges remaining in a power supply system after stopping supply of power in a semiconductor integrated circuit or a plasma display panel have been suggested (for example, Japanese Patent Application Laid-Open (JP-A) Nos. 9-121447, 10-163840, and 2003-263126).

However, in the conventional technologies, since time is needed for the remaining potential to be discharged after the supply of power is stopped, an erroneous operation may be generated. For example, a start-up circuit of an internal power supply of a semiconductor memory gradually increases supplied power, and outputs a control signal after a predetermined time when an internal voltage is more than an operation voltage of the circuit. However, when the power is supplied again after the supply of power is instantaneously interrupted, the control signal may not be output due to the remaining potential and the erroneous operation may be generated.

SUMMARY

The present invention provides a start-up circuit of an internal power supply of a semiconductor memory that may quickly discharge the remaining potential when supply of power is stopped.

A start-up circuit of an internal power supply of a semiconductor memory according to an aspect of the invention, there is provided a start-up circuit of an internal power supply of a semiconductor memory, including: an odd number of inverters that are connected in series and output a signal indicating whether or not to start to supply power from an internal power supply circuit of the semiconductor memory to an internal power supply circuit, and a discharge unit that is connected to the output side of an inverter at an odd-numbered stage and discharges charges remaining at the connection point between the inverter at the odd-numbered stage and the inverter at the stage immediately thereafter, after the power supplied to operate the inverters is stopped.

BRIEF DESCRIPTION OF THE DRAWINGS

Exemplary embodiments of the present invention will be described in detail based on the following figures, wherein.

DETAILED DESCRIPTION

Hereinafter, an exemplary embodiment of the present invention will be described in detail with reference to the accompanying drawings.

Figure 1:
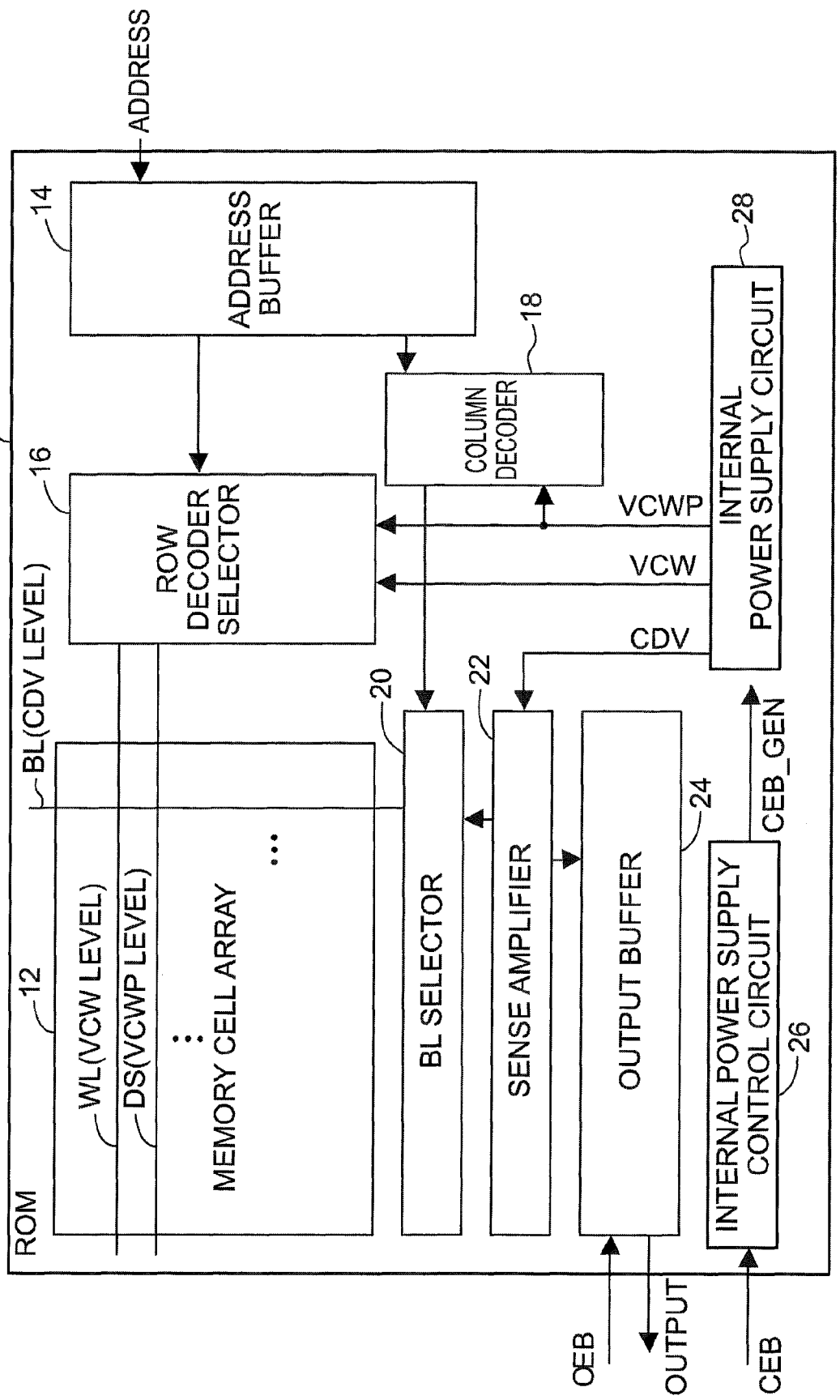
FIG. 1 is a diagram illustrating the schematic configuration of a ROM.

FIG. 1 illustrates the schematic configuration of a ROM 10 that functions as a semiconductor memory according to an exemplary embodiment of the invention. As illustrated in FIG. 1, the ROM 10 includes a memory cell array 12, an address buffer 14, a row decoder selector 16, a column decoder 18, a BL selector 20, a sense amplifier 22, an output buffer 24, an internal power supply control circuit 26, and an internal power supply circuit 28.

The memory cell array 12 is composed of plural sub-arrays, and each sub-array includes plural memory cells.

The address buffer 14 stores an address that is designated by a control circuit (not illustrated) that controls the ROM 10.

The row decoder selector 16 selects a sub-array selection line DS and a word line WL according to a row address included in the address stored in the address buffer 14, and applies a voltage VCW supplied from the internal power supply circuit 28 to the selected word line WL. The row decoder selector 16 applies a voltage VCWP supplied from the internal power supply circuit 28 to the sub-array selection line DS.

The column decoder 18 outputs a column address, which is included in the address stored in the address buffer 14, to a bit line (BL) selector 20.

The BL selector 20 selects a bit line BL according to the column address output from the column decoder 18 and applies a voltage CDV, which is supplied from the internal power supply circuit 28 through the sense amplifier 22, to the selected bit line BL.

The sense amplifier 22 detects a current flowing through a memory cell, which is selected by the word line WL selected by the row decoder selector 16 and the bit line BL selected by the BL selector 20, among memory cells constituting the memory cell array 12, and outputs data corresponding to a determination result of '0' or '1' to the output buffer 24.

The output buffer 24 stores the input data of the memory cell and outputs the stored data, when a level of an output enable signal OEB input from a control circuit (not illustrated) to control the ROM 10 becomes a low.

When a level of a chip enable signal CEB input from the control circuit to control the ROM 10 becomes low, the internal power supply control circuit 26 causes a level of the internal power supply circuit enable signal CEB_GEN to become low, to permit the supply of power from the internal power supply circuit 28 to the internal circuits such as the row decoder selector 16, the column decoder 18, and the sense amplifier 22. As a result, the voltage CDV is supplied from the internal power supply circuit 28 to the sense amplifier 22, the voltage VCW is supplied to the row decoder selector 16, and the voltage VCWP is supplied to the row decoder selector 16 and the column decoder 18.

When the chip enable signal CEB is at a low level, the ROM 10 enters in a normal operation mode. When the chip enable signal CEB is at a high level, the ROM 10 enters in a standby mode.

Figure 2:
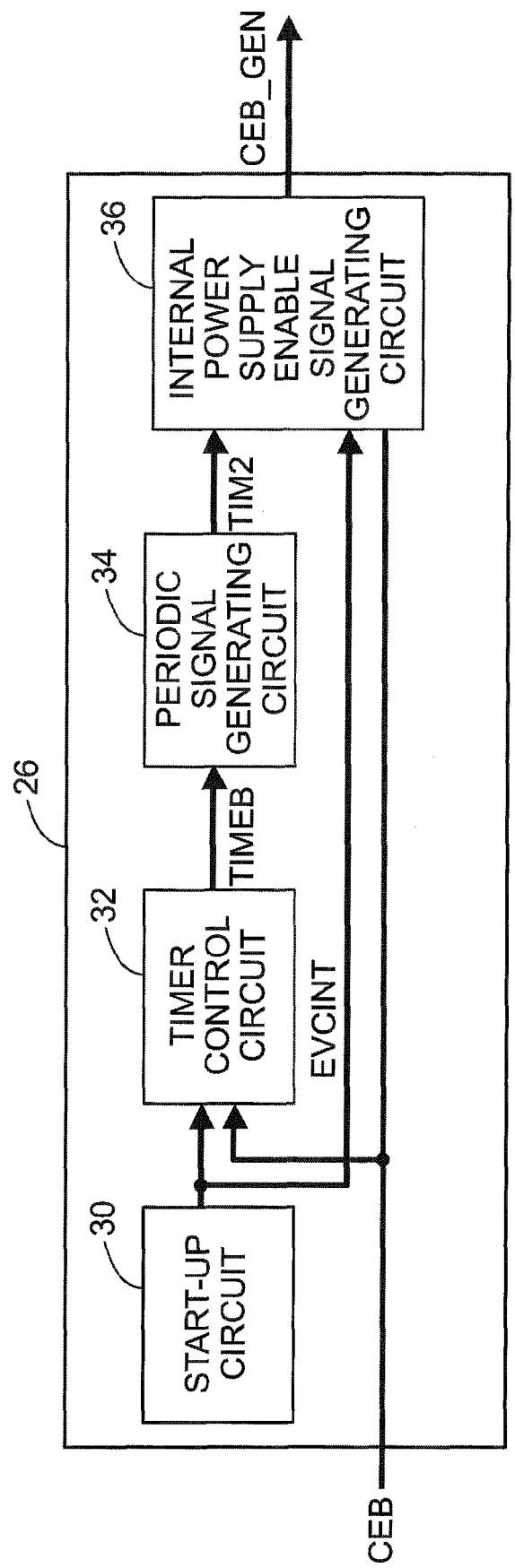
FIG. 2 is a diagram illustrating the schematic configuration of an internal power supply control circuit.

As illustrated in FIG. 2, the internal power supply control circuit 26 includes a start-up circuit 30, a timer control circuit 32, a periodic signal generating circuit 34, and an internal power supply enable signal generating circuit 36.

The start-up circuit 30 outputs a signal EVCINT (illustrated in the first graph of FIG. 3), of which a level is maintained at a low level during a constant period and then becomes high, when power is supplied, to the timer control circuit 32. During the period where the signal EVCINT is at a low level, the internal power supply circuit 28 enters in an always-on state. For this reason, the internal power supply circuit 28 enters in the always-on state during a predetermined period from the supply of the power. This is to increase various voltages such as the voltage VCWP to a necessary voltage level in a short time.

When the chip enable signal CEB is at a low level, that is, when the mode is the normal operation mode, the timer control circuit 32 always outputs a high-level signal. Only when the level of the chip enable signal CEB becomes high, the mode changes to the standby mode, and the level of the signal EVCINT input from the start-up circuit 30 is a high level, the timer control circuit 32 outputs a signal TIMEB (illustrated in the second graph of FIG. 3) whose level is switched to a low level to the periodic signal generating circuit 34.

When the level of the signal EVCINT is low, the level of the signal TIMEB becomes high and the periodic signal generating circuit 34 does not operate.

Figure 3:
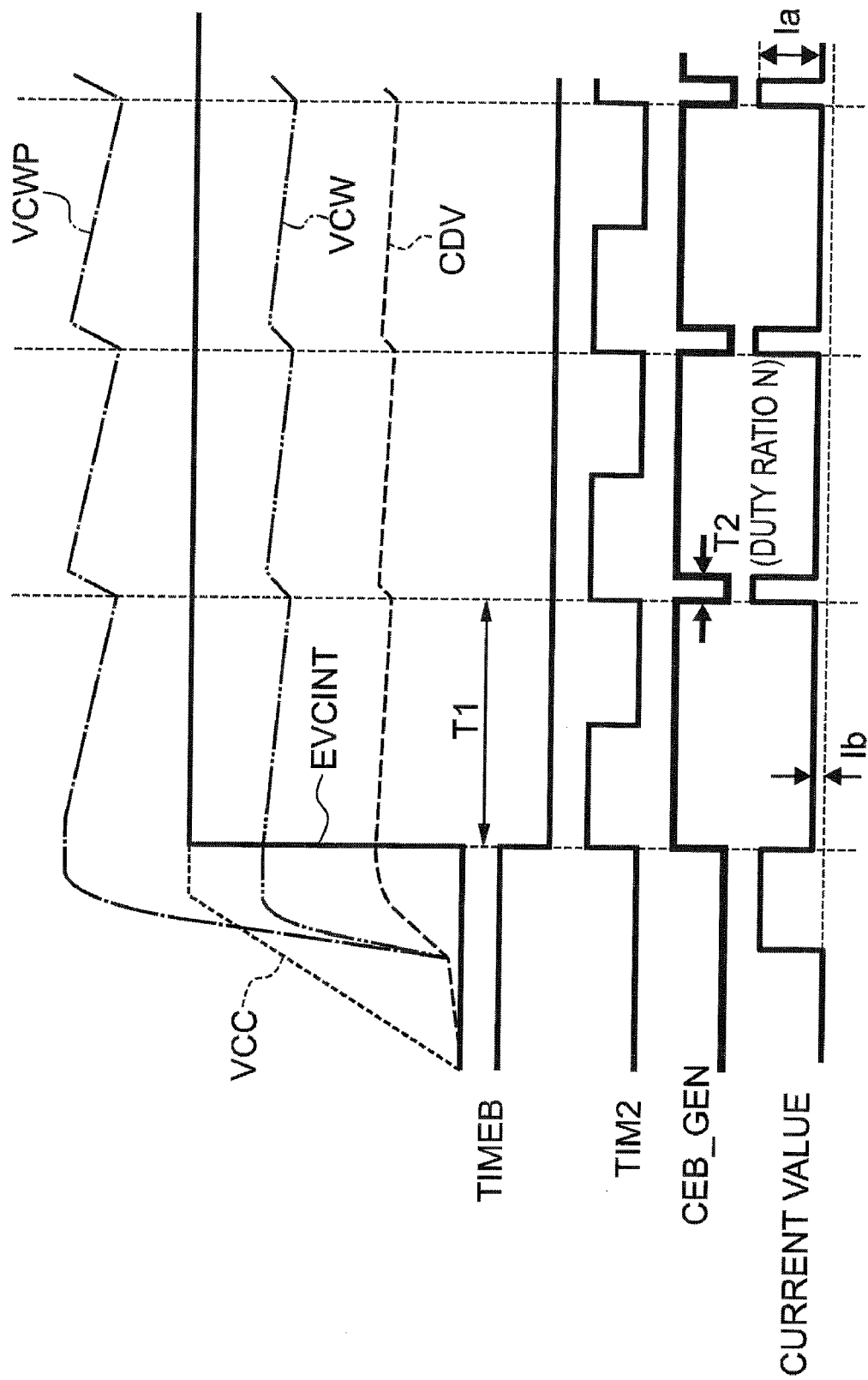
FIG. 3 illustrates waveforms of signals from individual components of the internal power supply control circuit and an internal power supply circuit.

When the level of the signal TIMEB input from the timer control circuit 32 becomes low, the periodic signal generating circuit 34 outputs a period signal TIM2, which repeats a high level and a low level with a predetermined period T1 as illustrated in the third graph of FIG. 3, to the internal power supply enable signal generating circuit 36.

The internal power supply enable signal generating circuit 36 outputs to the internal power supply circuit 28 the internal power supply enable signal CEB_GEN whose level becomes low during a predetermined period T2 with a predetermined duty ratio N in synchronization with a rising edge of the periodic signal TIM2 input from the periodic signal generating circuit 34.

When the chip enable signal CEB is at a low level, the internal power supply enable signal generating circuit 36 always maintains the level of the internal power supply enable signal CEB_GEN at a low level.

Figure 4:
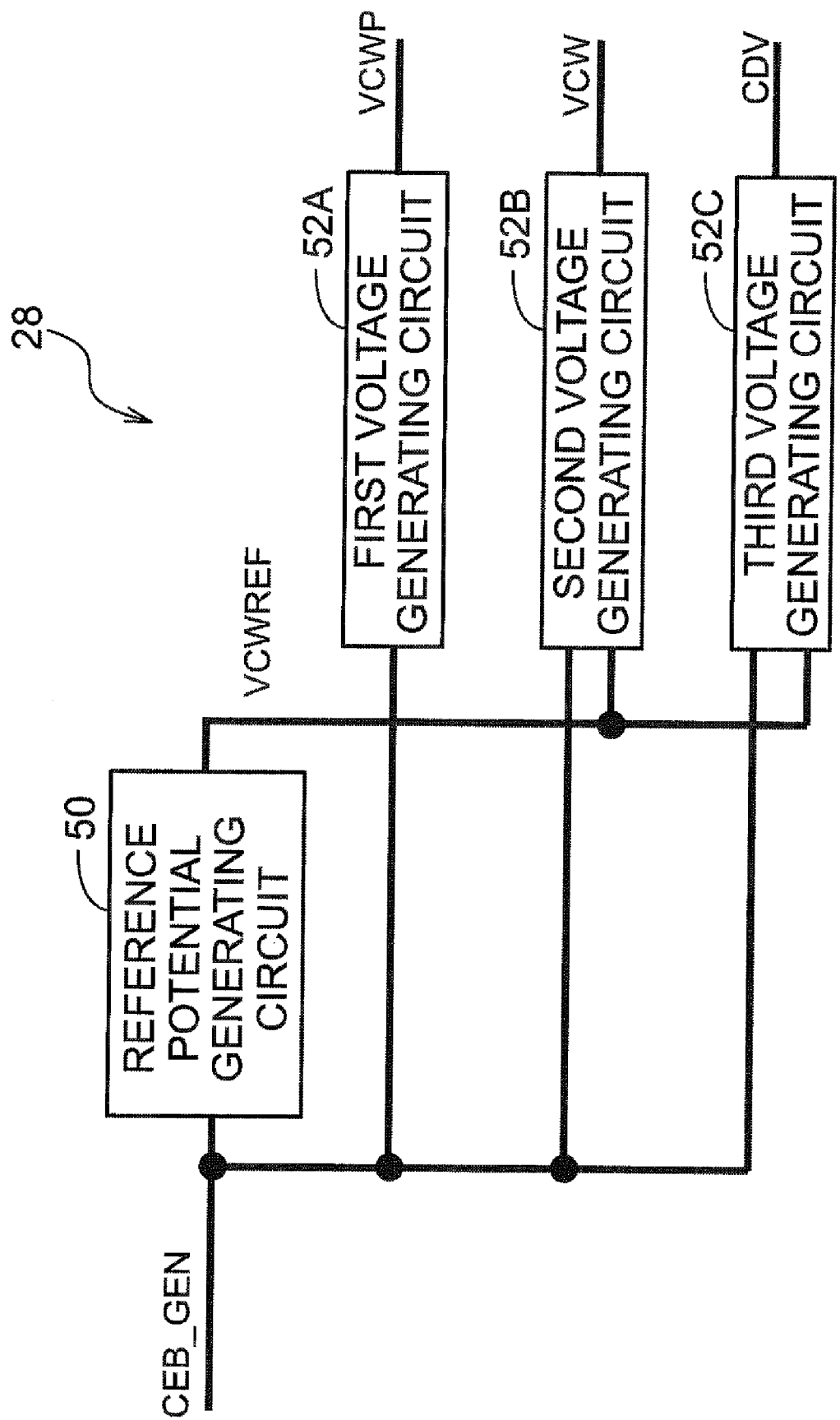
FIG. 4 is a diagram illustrating the schematic configuration of the internal power supply circuit.

As illustrated in FIG. 4, the internal power supply circuit 28 includes a reference potential generating circuit 50, a first voltage generating circuit 52A to generate a voltage VCWP, a second voltage generating circuit 52B to generate a voltage VCW, and a third voltage generating circuit 52C to generate a voltage CDV.

When the level of the internal power supply enable signal CEB_GEN output from the internal power supply enable signal generating circuit 36 becomes low, the reference potential generating circuit 50 generates a reference voltage VCWREF and outputs the reference voltage VCWREF to the first to third voltage generating circuits 52A to 52C.

The first voltage generating circuit 52A generates the voltage VCWP, on the basis of the input reference voltage VCWREF, and outputs the voltage VCWP to the row decoder selector 16 and the column decoder 18.

The second voltage generating circuit 52B generates the voltage VCW, on the basis of the input reference voltage VCWREF, and outputs the voltage VCW to the row decoder selector 16.

The third voltage generating circuit 52C generates the voltage CDV, on the basis of the input reference voltage VCWREF, and outputs the voltage CDV to the sense amplifier 22.

When the level of the internal power supply enable signal CEB_GEN output from the internal power supply enable signal generating circuit 36 becomes low, the internal power supply circuit 28 supplies power to the individual components in the ROM 10. The bottom graph of FIG. 3 illustrates a waveform of a consumption current of the internal power supply circuit 28 in the standby mode.

As such, in the standby mode, the internal power supply enable signal CEB_GEN is a signal that intermittently permits the supply of power from the internal power supply circuit 28. When the internal power supply enable signal CEB_GEN is at a high level, the consumption current of the internal power supply circuit 28 becomes almost zero. Thereby, in the standby mode, since the ROM 10 intermittently operates, as illustrated in the first graph of FIG. 3, the voltages VCWP, VCW, and CDV that are output from the internal power supply circuit 28 output the same set values as those at the time of normal operation during the period T2 where the level of the internal power supply enable signal CEB_GEN becomes low, during the period where the signal TIMEB is at a low level, and gradually decrease during the other periods. This operation is repeated.

Therefore, even in the standby mode, the consumption current may be suppressed while a voltage level is maintained at an arbitrary level. As a result, the consumption current of the ROM 10 in the standby mode may be suppressed. When the mode changes to the normal operation mode, the level of the voltage that is applied to the individual components of the ROM 10 may be quickly increased to a necessary level, which results in suppressing an access speed from being lowered.

Figure 5:
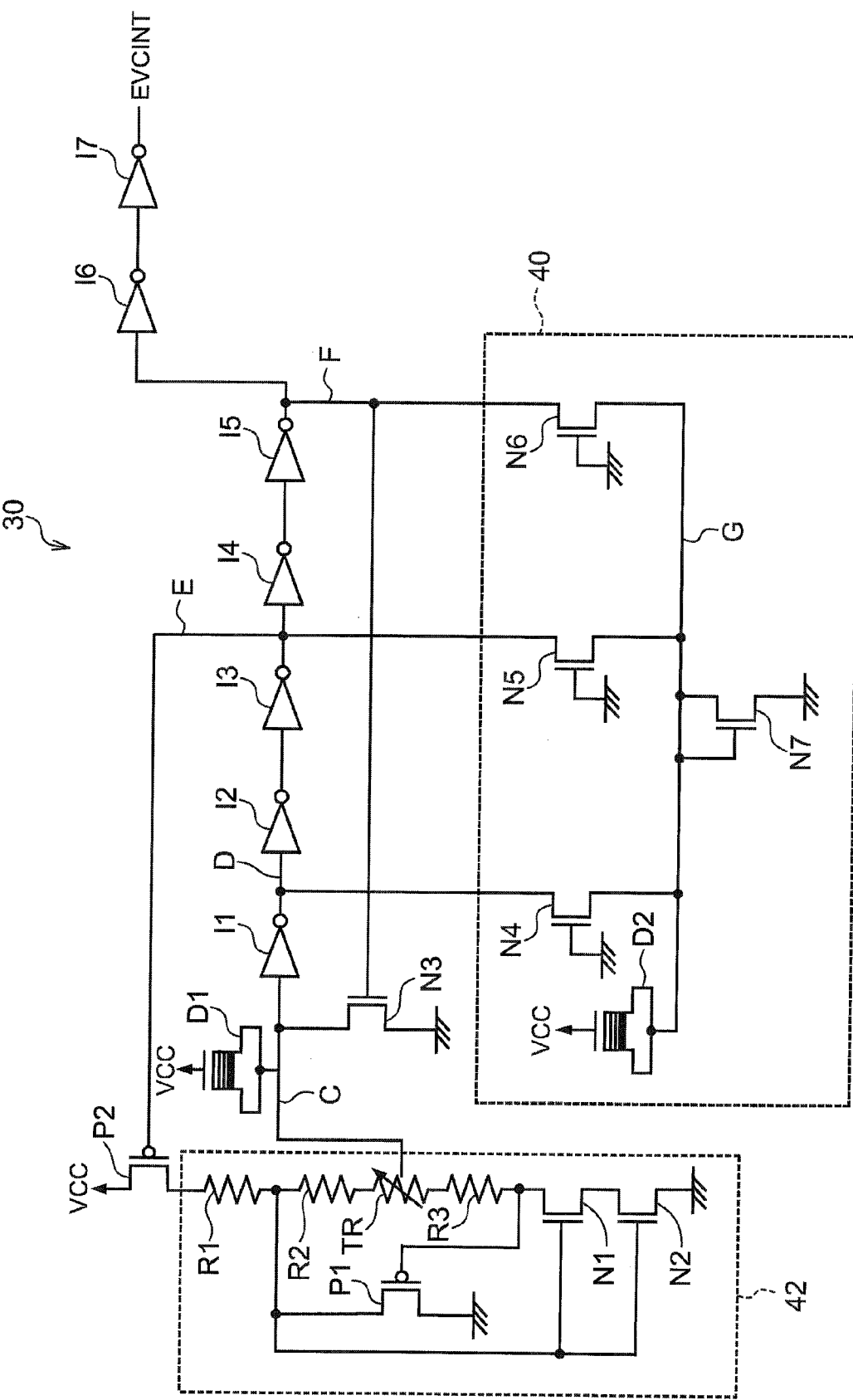
FIG. 5 is a circuit diagram of a start-up circuit.

Next, the start-up circuit 30 according to the exemplary embodiment will be described in detail. FIG. 5 illustrates the schematic configuration of the start-up circuit 30 according to the exemplary embodiment. The start-up circuit 30 according to the exemplary embodiment is operated when the power supply voltage VCC is supplied.

As illustrated in FIG. 5, the start-up circuit 30 includes inverters I1 to I7 of an odd number that are connected in series, a discharge circuit 40, and an initial stage circuit 42. When the supply of the power supply voltage (hereinafter, referred to as voltage VCC) from the power supply VCC is stopped, the discharge circuit 40 discharges the potential that remains at a connection point of the inverters I1 and I2, a connection point of the inverters I3 and I4, and a connection point of the inverters I5 and I6.

The initial stage circuit 42 includes a PMOS transistor P1, NMOS transistors N1 and N2, resistors R1, R2, and R3, and a trimming resistor TR.

The resistors R1, R2, and R3 and the trimming resistor TR are connected in series. The trimming resistor TR is a trimming circuit that adjusts a resistance value to adjust the voltage VCC. In the exemplary embodiment, the resistance value may be adjusted to a value from 1.5 to 40 kΩ. In the exemplary embodiment, as a specific example, the resistance values of the resistors R1, R2, and R3 are set to 5 kΩ, 20 kΩ, and 35 kΩ respectively.

In the PMOS transistor P1, a source is connected to a connection point of the resistors R1 and R2, a gate is connected to a connection point of the resistor R3 and the NMOS transistor N1, and a drain is connected to a ground.

The NMOS transistors N1 and N2 are connected in series, and a drain of the NMOS transistor N1 is connected to the resistor R3 and a source of the NMOS transistor N2 is connected to the ground. Gates of the NMOS transistors N1 and N2 are connected to the connection point of the resistors R1 and R2.

In the PMOS transistor P2, a source is connected to the power supply VCC, a gate is connected to the output side of the inverter I3, and a drain is connected to the resistor R1 of the initial stage circuit 42.

The input side of the inverter I1 is connected to the trimming resistor TR of the initial stage circuit 42 and receives a voltage signal that is adjusted by the trimming resistor TR. The output side of the inverter I1 is connected to the input side of the inverter I2 of a next stage. The input sides of the inverters I2 to I6 are connected to the inverters I1 to I5 of the previous stages, respectively, and the output sides thereof are connected to the input sides of the inverters I3 to I7 of the following stages, respectively. The input side of the inverter I7 is connected to the output side of the inverter I6 of the previous stage. The output side of the inverter I7 is connected to the timer control circuit 32 and the internal power supply enable signal generating circuit 36 and outputs the signal EVCINT.

In the DMOS transistor D1, a drain and a source that are connected to each other are connected to the trimming resistor TR of the initial stage circuit 42 and a gate is connected to the power supply VCC.

The discharge circuit 40 includes NMOS transistors N4 to N7 and a DMOS transistor D2.

In the NMOS transistors N4 to N6, drains are connected to the output sides of the inverters I1, I3, and I5, respectively, and gates are connected to the ground. The NMOS transistors N4 to N6 have functions of discharging (extracting) the charges remaining on a connection wiring line (wiring line D) of the inverters I1 and I2, a connection wiring line of the inverters I3 and I4, and a connection wiring line of the inverters I5 and I6 when the supply of power to a wiring line G from the power supply VCC is stopped, respectively.

In the DMOS transistor D2, a drain and a source that are connected to each other are connected to sources of the NMOS transistors N4 to N6 and gates are connected to the power supply VCC. The DMOS transistor D2 has a function of lowering the potential of the wiring line G by coupling capacitance.

In the NMOS transistor N7, a drain and a gate are connected to the wiring line (wiring line G) connecting the NMOS transistors N4 to N6 and the DMOS transistor D2 and a source is connected to the ground. The NMOS transistor N7 has a function of compensating for the potential of the wiring line G.

Figure 6:
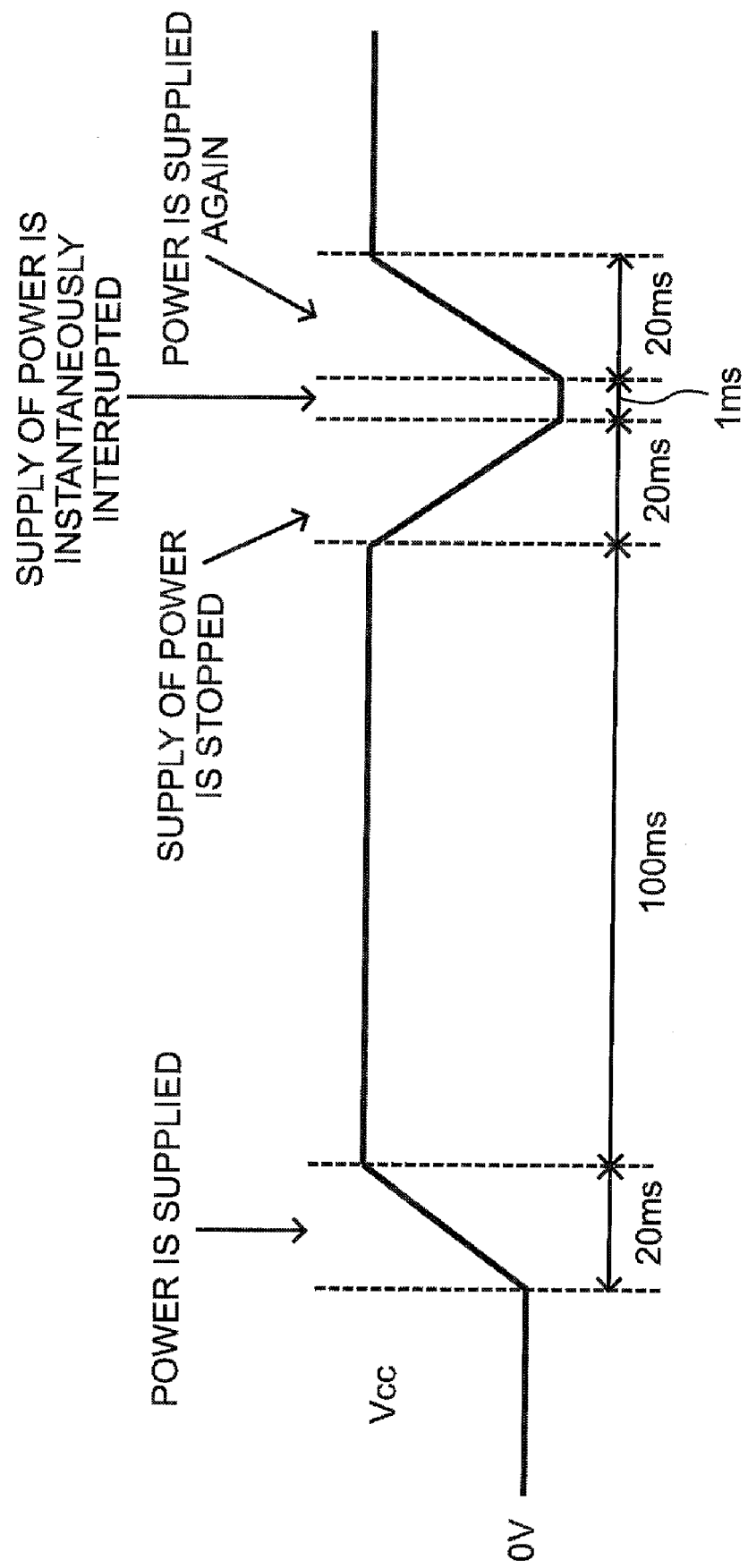
FIG. 6 is a diagram illustrating a supply pattern of power supply VCC of the start-up circuit.

Next, the operation of the start-up circuit 30 according to the exemplary embodiment will be described in detail. As illustrated in FIG. 6, each of the case where power is supplied from the power supply VCC, the case where the supply of power from the power supply VCC is stopped, the case where the supply of power from the power supply VCC is instantaneously interrupted, and the case where the power is supplied from the power supply VCC again will be described in detail.

Figure 7:
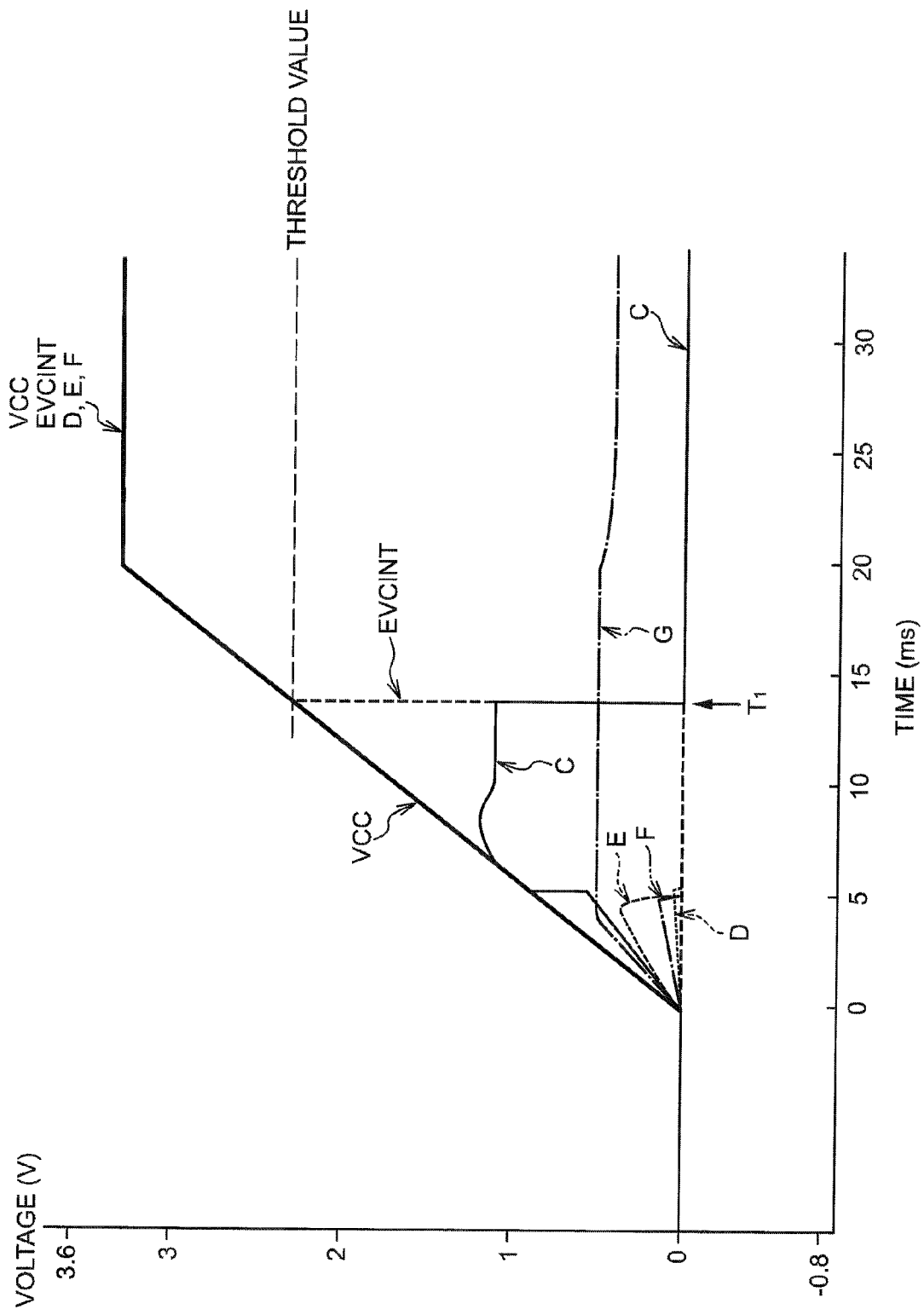
FIG. 7 is a diagram illustrating a relationship between a power supply voltage of the start-up circuit when power is supplied, a signal EVCINT, and voltages of individual components.

First, the operation in the case where power is supplied will be described. FIG. 7 illustrates a relationship between the voltage VCC when power is supplied from the power supply VCC, the signal EVCINT, the voltage of the wiring line C connecting the input side of the inverter I1 and the trimming resistor TR, the voltage of the wiring line D connecting the output side of the inverter I1 and the input side of the inverter I2, the voltage of the wiring line E connecting the gate of the PMOS transistor P2 and the drain of the NMOS transistor N5, the voltage of the wiring line F connecting the output side of the inverter I5 and the drain of the NMOS transistor N6, and the voltage of the wiring line G connecting the NMOS transistors N4 to N6 and the source and the gate of the DMOS transistor D2.

When the power supply voltage is supplied, the voltage VCC increases. If the voltage exceeds the operation voltage of the initial stage circuit 42, a constant voltage value is output from the initial stage circuit 42 to the wiring line C. Accordingly, a voltage value of the wiring line C becomes constant. The DMOS transistor D1 of the initial stage circuit 42 has a function of increasing a level of the wiring line C by coupling with the power supply voltage before the voltage reaches the power supply voltage where the initial stage circuit 42 may be operated. By this function, before the voltage reaches the power supply voltage where the initial stage circuit 42 may be operated, the inverter I1 of the next stage determines the level of the wiring line C as a low level and prevents occurrence of the case where the level of the output D becomes high and the level of the signal EVCINT becomes high.

When the voltage VCC further increases, at timing (timing T1) when the voltage is more than a threshold value of the voltage of the circuit (inverter I1) of the next stage, the level of the output signal output from the inverter I1 changes from a low level to a high level. Accordingly, the voltage value of the wiring line D becomes a high-level voltage value.

When the level of the signal output from the inverter I1 changes from a low level to a high level, the levels of the signals that are output from the inverters I2 to I7 change, and the signal EVCINT at a high level is output from the inverter I7. Accordingly, when the voltage level of the wiring line D changes to a high level, the voltage level of each of the wiring line E, the wiring line F, and the signal EVCINT changes to a high level. The PMOS transistor P2 and the NMOS transistor N3 have a function of causing the initial stage circuit 42 not to operate after the voltage level of each of the wiring lines E and F changes to a high level. The PMOS transistor P2 has a function of separating the initial stage circuit 42 from the power supply voltage and the NMOS transistor N3 has a function of clamping the level of the wiring line C corresponding to the output of the initial stage circuit 42 to the ground. This is to prevent the operation current of the initial stage circuit 42 from being added to the standby current, after the level of the signal EVCINT becomes high.

The voltage value of the wiring line G increases by coupling due to the increase in the voltage VCC. However, the voltage value of the wiring line G is clamped with the voltage Vtn (threshold value of the NMOS transistor N7), by the NMOS transistor N7. That is, the voltage value of the wiring line G is compensated with the voltage Vtn by the NMOS transistor N7. At this time, the NMOS transistors N4 to N6 do not operate, because the gate voltage is 0 V. Therefore, in the operation in the case where the power is supplied, the discharge circuit 40 does not affect the charges of the individual wiring lines.

Figure 8:
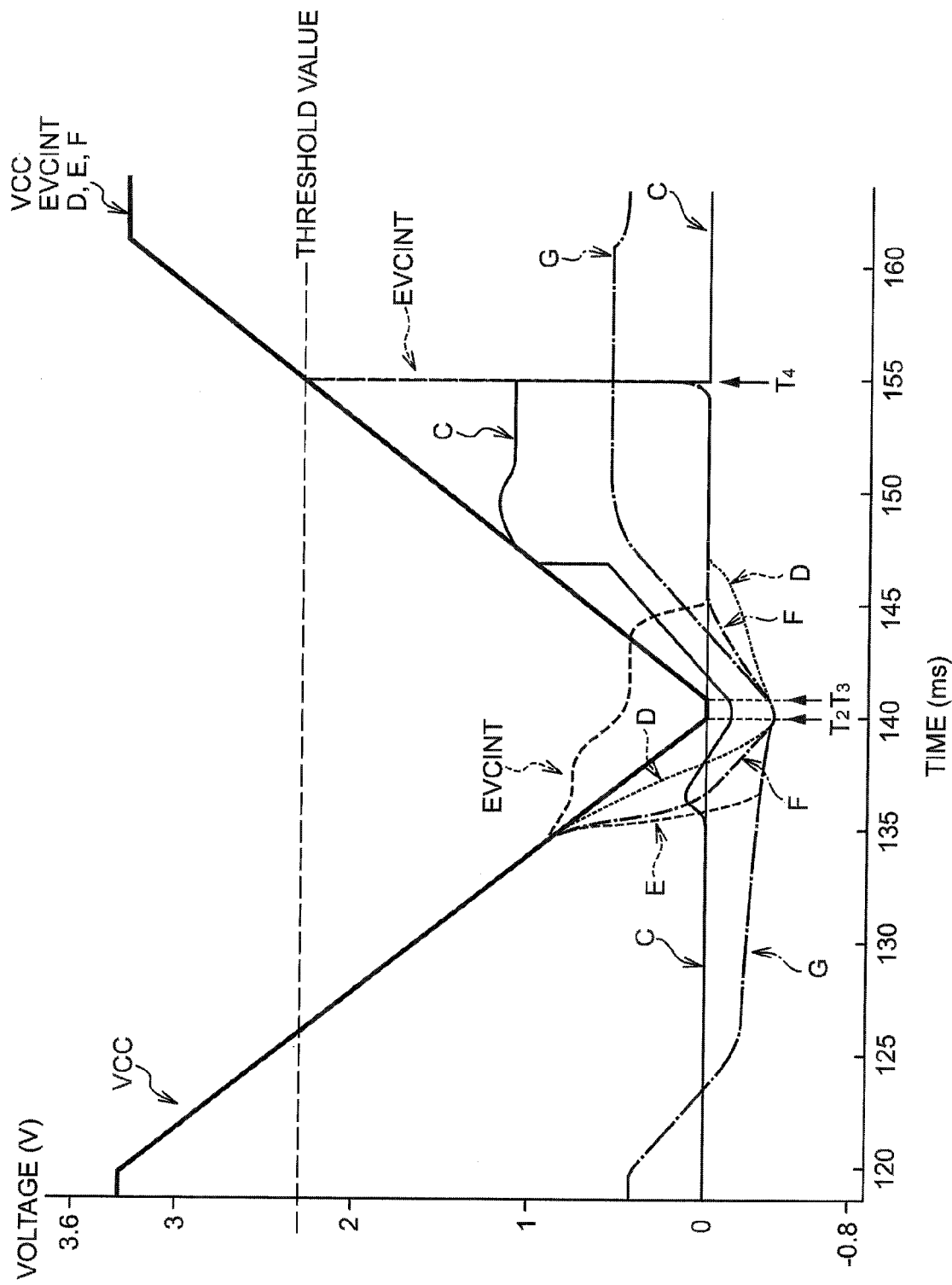
FIG. 8 is a diagram illustrating a relationship between the power supply voltage of the start-up circuit in each of the case where supply of power is stopped, the case where the supply of power is instantaneously interrupted, and the case where the power is supplied again, the signal EVCINT, and the voltages of the individual components.

Next, each of the case where supply of power is stopped, the case where the supply of power is instantaneously interrupted, and the case where the power is supplied again will be described. FIG. 8 illustrates a relationship between the voltage VCC in each of the case where supply of power is stopped, the case where the supply of power is instantaneously interrupted, and the case where the power is supplied again, the signal EVCINT, the voltage of the wiring line C connecting the input side of the inverter I1 and the trimming resistor TR, the voltage of the wiring line D connecting the output side of the inverter I1 and the input side of the inverter I2, the voltage of the wiring line E connecting the gate of the PMOS transistor P2 and the drain of the NMOS transistor N5, the voltage of the wiring line F connecting the output side of the inverter I5 and the drain of the NMOS transistor N6, and the voltage of the wiring line G connecting the NMOS transistors N4 to N6 and the source and the gate of the DMOS transistor D2.

When the supply of power supply voltage is stopped, the voltage VCC decreases. Due to the decrease in the voltage VCC, the potential of the wiring line G decreases. After the potential of the wiring line G decreases until a negative area (minus voltage), a current flows from a board (P-sub, voltage VSS) of the NMOS transistors N4 to N6 and the NMOS transistor N7 to the wiring line G. Therefore, in the exemplary embodiment, the voltage decreases to −0.4 to −0.5 V.

If the voltage VCC decreases to a voltage (about 0.8 V in FIG. 8) that is not more than the threshold voltage Vt of the PMOS transistor constituting the inverters I1 to I7, the operation of the PMOS transistor that constitutes the inverters I1, I3, and I5 is stopped and the inverters I1, I3, and I5 stop the output of the signals. Therefore, the supply of current to the wiring lines D, E, and F is stopped. At this time, the charges remain on the wiring lines D, E, and F.

If the potential of the wiring line G is lowered to the negative potential, the NMOS transistors N4 to N6 operate. Thus, the remaining charges of the wiring lines D, E, and F are extracted by the NMOS transistors N4, N5, and N6 and are discharged. Accordingly, as illustrated in FIG. 8, the potential of each of the wiring lines D, E, and F is rapidly lowered. When the voltage VCC is 0 V (timing T2), the potential becomes almost equal to the potential of the wiring line G.

At this time, the gate/source voltages Vgs of the NMOS transistors N4 to N6 are similar to the threshold value Vt and are in a sub-threshold area (several hundreds nA order). However, since the NMOS transistors N4 to N6 discharge only the gate capacitances (several tens fF order), the gate capacitance may be discharged with several hundreds μS order.

That is, a dimension (gate width) of each of the NMOS transistors N4 to N6 may be determined from the gate capacitance and the time where discharge needs to be completed. Accordingly, the discharge may be completed in a desired time, using the NMOS transistors N4 to N6 having the appropriate dimensions and the gate capacitances.

Thereby, at timing T3 after the supply of power is instantaneously interrupted for time of I ins from the timing T2 when the voltage VCC is 0 V, when the power is supplied again, the charges do not remain on the wiring lines D, E, and F. Therefore, at timing T4, the level of the signal EVCINT output from the inverter I7 is switched from a low level to a high level. That is, since the same operation as the operation in the case where the power is supplied as illustrated in FIG. 7 is performed, the operation is normally performed without causing the erroneous operation.

In the exemplary embodiment, the DMOS transistor D2 is used as the MOS transistor having the function of lowering the potential of the wiring line G by the coupling capacitance. However, the invention is not limited thereto, and the NMOS transistor may be used. Since the DMOS transistor is normally operated even when the threshold value Vt is the negative potential, the DMOS transistor is preferably used.

In the exemplary embodiment, in order to discharge the charges remaining on the wiring lines, D, E, and F when the supply of power from the power supply VCC is stopped to the wiring line G, the three NMOS transistors (NMOS transistors N4 to N6) are used. However, the number of NMOS transistors is not limited to the three, and may be the different number (for example, one or two). Regardless of the number of NMOS transistors, the drains of the NMOS transistors may be connected to a connection point of the output side of the inverter I of which the output is at a high level, that is, the output side of the inverter I of the odd-numbered stage and the input side of the inverter I of the next stage of the inverter I of the odd-numbered stage. When the number of NMOS transistors is small, the size of the NMOS transistor may be increased as compared with the exemplary embodiment.

The NMOS transistors N4 to N6 may be of the same type, but may be of different types based on the gate capacitances or the sizes of the connected inverters.

In the exemplary embodiment, the case where the invention is applied to the ROM functioning as the semiconductor memory has been described, but the invention is not limited thereto. For example, the invention may be applied to any semiconductor memory, such as a DRAM, which has an internal power supply.

As described above, in the exemplary embodiment, the discharge circuit 40 includes the NMOS transistors N4 to N6 for discharge, the NMOS transistor N7 for potential compensation, and the DMOS transistor D2 that lowers the potential of the wiring line G by the coupling capacitance. When the supply of the power supply voltage VCC is stopped, the potential of the wiring line G is lowered to the negative potential by the DMOS transistor D2 and the NMOS transistor N7, and the NMOS transistors N4 to N6 operate and discharge the remaining charges of the wiring lines D, E, and F. Thereby, when the supply of power supply voltage VCC is stopped, the remaining potential of the wiring lines D, E, and F may be quickly discharged. Accordingly, when the power is supplied again after the supply of power is instantaneously interrupted, the erroneous operation may be prevented and the level of the signal EVCINT may be normally changed from a low level to a high level.

The start-up circuit of the internal power supply of the semiconductor memory according to one aspect of the invention, the discharge unit may include: an NMOS transistor for discharge whose drain is connected to the output side of the inverter at the odd-numbered stage and whose gate is connected to a ground, and a MOS transistor whose source and drain are connected to a source of the NMOS transistor and whose gate is connected to the power supply.

The start-up circuit of the internal power supply of the semiconductor memory according to one aspect of the invention, may include an NMOS transistor whose drain and gate are connected to a connection point between the NMOS transistor for discharge and the MOS transistor and whose source is connected to the ground.

The start-up circuit of the internal power supply of the semiconductor memory according to one aspect of the invention, wherein each the plural NMOS transistors for discharge are respectively connected to the output sides of the inverters at each of odd-numbered stages.

According to the start-up circuit of the internal power supply of the semiconductor memory according to one aspect of the invention, the remaining potential may be quickly discharged, when the supply of power is stopped.

What is claimed is:

1. A start-up circuit of an internal power supply of a semiconductor memory, comprising:

an odd number of inverters that are connected in series and output a signal indicating whether or not to start to supply power from an internal power supply circuit of the semiconductor memory to an internal power supply circuit, and a discharge unit that is connected to an output side of an inverter at an odd-numbered stage and discharges charges remaining at the connection point between the inverter at the odd-numbered stage and the inverter at the stage immediately thereafter, after supply of power to operate the inverters is stopped.

2. The start-up circuit of the internal power supply of a semiconductor memory of claim 1, wherein the discharge unit comprises:

an NMOS transistor for discharge whose drain is connected to the output side of the inverter at the odd-numbered stage and whose gate is connected to a ground, and a MOS transistor whose source and drain are connected to the source of the NMOS transistor and whose gate is connected to the power supply.

3. The start-up circuit of the internal power supply of a semiconductor memory of claim 2, further comprising: an NMOS transistor whose drain and gate are connected to a connection point between the NMOS transistor for discharge and the MOS transistor, and whose source is connected to the ground.

4. The start-up circuit of the internal power supply of a semiconductor memory of claim 2, wherein each of a plurality of the NMOS transistors for discharge are respectively connected to the output sides of the inverters at each of odd-numbered stages.

5. The start-up circuit of the internal power supply of a semiconductor memory of claim 3, wherein each of a plurality of the NMOS transistors for discharge are respectively connected to the output sides of the inverters at each of odd-numbered stages.

6. The start-up circuit of the internal power supply of a semiconductor memory of claim 1, wherein the MOS transistor is a DMOS transistor.

* * * * *